(12) United States Patent
Sumitomo et al.

(10) Patent No.: US 10,103,255 B2
(45) Date of Patent: Oct. 16, 2018

(54) SEMICONDUCTOR DEVICE

(71) Applicant: DENSO CORPORATION, Kariya, Aichi-pref. (JP)

(72) Inventors: Masakiyo Sumitomo, Kariya (JP); Masahiro Ogino, Kariya (JP); Yukihiro Kato, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/544,898

(22) PCT Filed: Feb. 22, 2016

(86) PCT No.: PCT/JP2016/000925
§ 371 (c)(1),
(2) Date: Jul. 20, 2017

(87) PCT Pub. No.: WO2016/136230
PCT Pub. Date: Sep. 1, 2016

(65) Prior Publication Data
US 2018/0019331 A1  Jan. 18, 2018

(30) Foreign Application Priority Data

Feb. 25, 2015 (JP) .................. 2015-035360
Feb. 17, 2016 (JP) .................. 2016-028255

(51) Int. Cl.
*H01L 29/739* (2006.01)
*H01L 23/485* (2006.01)
*H01L 29/78* (2006.01)

(52) U.S. Cl.
CPC ........ *H01L 29/7394* (2013.01); *H01L 23/485* (2013.01); *H01L 29/78* (2013.01)

(58) Field of Classification Search
CPC .... H01L 29/7394; H01L 23/485; H01L 29/78
See application file for complete search history.

(56) References Cited

U.S. PATENT DOCUMENTS

2004/0084722 A1* 5/2004 Yamaguchi ......... H01L 29/0696
257/330
2004/0188756 A1  9/2004 Matsuda
2004/0207009 A1  10/2004 Yamaguchi et al.
2005/0263853 A1  12/2005 Tomomatsu et al.
2006/0006409 A1  1/2006 Yamaguchi et al.

(Continued)

FOREIGN PATENT DOCUMENTS

JP  2010-251608 A  11/2010

*Primary Examiner* — Nathan W Ha
(74) *Attorney, Agent, or Firm* — Posz Law Group, PLC

(57) ABSTRACT

A semiconductor device includes: a semiconductor substrate having a drift layer; a base layer and a carrier storage layer over the drift layer; a collector layer on the drift layer opposite to the base layer; multiple trenches penetrating the base layer and the carrier storage layer and reaching the drift layer; a gate electrode on an insulation film in each trench; and an emitter region in a surface portion of the base layer contacting each trench. A thickness of at least a portion of a part of the gate insulation film on a sidewall of each trench on a collector layer side from a peak position, at which the impurity concentration of the carrier storage layer is highest, is thicker than a thickness of another part of the gate insulation film on the sidewall of an opening portion side of the trench from the peak position.

5 Claims, 5 Drawing Sheets

(56) References Cited

U.S. PATENT DOCUMENTS

| | | |
|---|---|---|
| 2007/0114570 A1 | 5/2007 | Yamaguchi et al. |
| 2012/0018798 A1* | 1/2012 | Mauder ................. H01L 29/407 |
| | | 257/328 |
| 2012/0056241 A1 | 3/2012 | Sumitomo et al. |
| 2012/0146091 A1 | 6/2012 | Tanabe et al. |
| 2012/0273836 A1 | 11/2012 | Sadamatsu et al. |
| 2012/0286355 A1* | 11/2012 | Mauder ................. H01L 29/408 |
| | | 257/330 |

* cited by examiner

SEMICONDUCTOR DEVICE

CROSS REFERENCE TO RELATED APPLICATIONS

This application is a U.S. national stage application of International Patent Application No. PCT/JP2016/000925 filed on Feb. 22, 2016 and is based on Japanese Patent Applications No. 2015-35360 filed on Feb. 25, 2015, and No. 2016-28255 filed on Feb. 17, 2016, the disclosures of which are incorporated herein by reference.

TECHNICAL FIELD

The present disclosure relates to a semiconductor device having a trench gate type insulated gate bipolar transistor (i.e., IGBT).

BACKGROUND ART

Conventionally, a semiconductor device having an IGBT is well known to be utilized in an electronic equipment such as an industrial motor (for example, see Patent Literature No. 1).

Specifically, in the semiconductor device, a base layer is formed in a surface portion of a semiconductor substrate having a drift layer with a N-conductive type, and a carrier storage layer (i.e., CS layer) is formed between the base layer and the drift layer. Multiple trenches are formed to penetrate the base layer and the CS layer. Each trench is filled with a gate insulation film on a sidewall of the trench and a gate electrode on the gate insulation film. An emitter region having a N+ conductive type is formed in a surface portion of the base layer to contact with the trench.

A collector layer having a P+ conductive type is formed on a back side of the semiconductor substrate. An emitter electrode is formed on a front side of the semiconductor substrate to be electrically connected to the base layer and the emitter region. A collector electrode is formed on the backside of the semiconductor substrate to be electrically connected to the collector layer.

In the semiconductor device, when a voltage lower than the collector electrode is applied to the emitter electrode, and further, a voltage equal to or larger than a threshold voltage Vth of an insulation gate structure is applied to the gate electrode, an inversion layer (i.e., a channel) having the N conductive type is formed at a portion of the base layer contacting with the trench, and an accumulation layer of an electron is formed at a portion of the drift layer and a portion of the CS layer contacting with the trench. Further, the electron is supplied to the drift layer via the accumulation layer and the inversion layer from the emitter region, and the hole is supplied to the drift layer from the collector layer. Thus, the resistance of the drift layer is reduced by conductivity modulation, so that the device becomes an on state. At this moment, since the hole accumulated in the drift layer is restricted by the CS layer from discharging to the emitter electrode via the base layer, the on state voltage is reduced.

However, in the semiconductor device, although the on-state voltage is reduced by the CS layer, a difficulty arises such that a switching controllability is reduced when switching from the off state to the on state since the CS layer is formed. Here, the off state indicates a feature such that current does not flow between the collector electrode and the emitter electrode. The on state indicates a feature such that the current flows between the collector electrode and the emitter electrode.

Thus, when a predetermined voltage is applied to the gate electrode, the gate potential increases gradually. Then, when the gate potential becomes equal to or larger than the threshold voltage Vth, the current starts to flow between the collector electrode and the emitter electrode. In this case, the hole supplied to the drift layer is restricted by the CS layer from discharging from the emitter electrode, and the hole is drawn to the accumulation layer. Here, since the hole is easily accumulated near the CS layer, the hole is easily accumulated at a portion of the accumulation layer disposed near the CS layer. The gate potential is changed by the hole accumulated at the portion, and therefore, the switching controllability is reduced.

PATENT LITERATURE

Patent Literature 1: JP-2005-347289-A

SUMMARY

It is an object of the present disclosure to provide a semiconductor device with reducing an on-state voltage and restricting reduction of the switching controllability.

According to an aspect of the present disclosure, a semiconductor device includes: a semiconductor substrate having a drift layer with a first conductive type; a base layer having a second conductive type and disposed on the drift layer; a carrier storage layer having the first conductive type with an impurity concentration higher than the drift layer, and arranged over the drift layer; a collector layer having the second conductive type and arranged on the drift layer opposite to the base layer; a plurality of trenches penetrating the base layer and the carrier storage layer, reaching the drift layer, and arranged along one direction of a planar direction of the semiconductor substrate; a gate insulation film arranged on a sidewall of each trench; a gate electrode arranged on the gate insulation film; and an emitter region having the first conductive type, arranged in a surface portion of the base layer, and contacting each trench. A thickness of at least a portion of a part of the gate insulation film arranged on a sidewall of each trench disposed on a collector layer side from a peak position, at which the impurity concentration of the carrier storage layer is highest, is thicker than a thickness of another part of the gate insulation film arranged on the sidewall of each trench disposed on an opening portion side of the trench from the peak position.

In the above semiconductor device, when the device is switched from the off state to the on state, even if the carrier is accumulated near the sidewall of the trench disposed near the CS layer, the variation of the gate potential caused by the carrier is restricted at the thick part of the gate insulation film since the thick gate insulation film is formed on at least a part of the sidewall of the trench. Accordingly, the on state voltage is reduced, and the reduction of the switching controllability is restricted.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
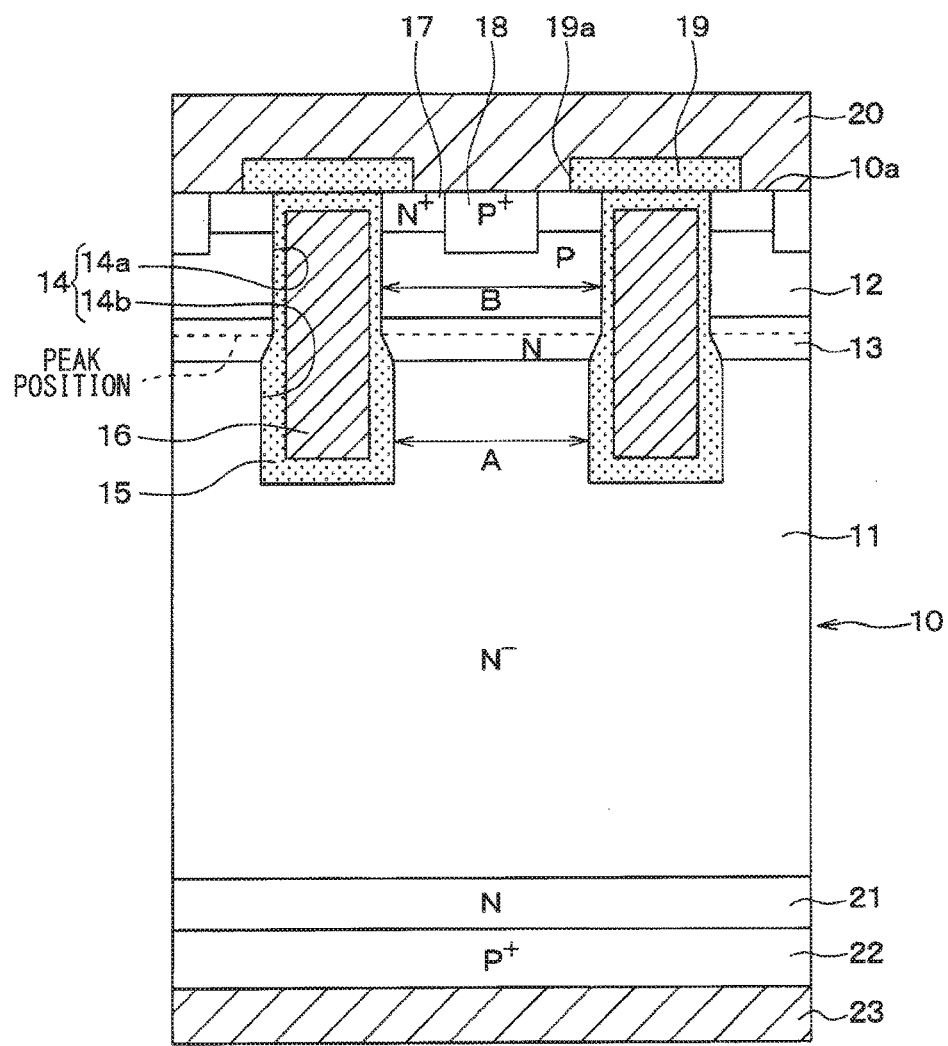
FIG. 1 is a diagram showing a cross sectional view of a semiconductor device according to a first embodiment.

Embodiments of the present disclosure will be explained with reference to the drawings as follows. Here, the embodiments are explained such that the same or the corresponding portion in each embodiment has the same reference numeral.

First Embodiment

A first embodiment will be explained. A semiconductor device according to the present embodiment may be preferably utilized as a power switching device in a power source circuit such as an inverter and a DC-DC converter, for example.

As shown in FIG. 1, the semiconductor device includes a semiconductor substrate 10 having a N− conductive type functioning as a drift layer 11. A base layer 12 having a P conductive type and a CS layer 13 having an impurity concentration higher than the drift layer 11 are formed on the drift layer 11 (i.e., on one surface 10a side of the semiconductor substrate 10). In the present embodiment, the CS layer 13 is formed between the drift layer 11 and the base layer 12. Thus, the CS layer 13 and the base layer 12 are formed on the drift layer 11 in turn from the drift layer 11 side.

Multiple trenches 14 are formed to penetrate the base layer 12 and the CS layer 13 and to reach the drift layer 11. The base layer 12 and the CS layer 13 are divided by the trenches 14. Multiple trenches 14 in the present embodiment are formed to have a stripe pattern at regular intervals along one direction of a planar direction on the one surface 10a of the semiconductor substrate 10 (i.e., along a direction perpendicular to a sheet of the drawing in FIG. 1).

Each trench 14 is filled with a gate insulation film 15 formed to cover a sidewall of each trench 14 and a gate electrode made of poly silicon or the like and formed on the gate insulation film 15. Thus, the trench gate structure is prepared. The trench gate structure in the present embodiment will be explained in detail as follows.

Each trench 14 in the present embodiment includes a first trench 14a providing an opening portion of the trench 14 and formed to a middle portion of the CS layer 13 and a second trench 14b connected to the first trench 14a and reaching the drift layer 11. Specifically, the second trench 14b is connected to the first trench 14a at a peak position of the highest impurity concentration of the CS layer 13. Thus, the first trench 14a is formed to the peak position of the CS layer 13 from the one surface 10a of the semiconductor substrate 10.

Here, in FIG. 1, the peak position is shown by a dotted line. Further, the CS layer 13 is formed by a conventional semiconductor process such that the impurity having the N conductive type is ion-implanted, and then, the thermal treatment is executed. Accordingly, the peak position of the CS layer 13 is a middle position between the drift layer 11 and the base layer 12 in the stacking direction. In other words, the peak position of the CS layer 13 is disposed in an inside of the CS layer 13. Further, in other words, the peak position of the CS layer 13 in the present embodiment is disposed between a boundary between the CS layer 13 and the drift layer 11 and a boundary between the CS layer 13 and the base layer 12.

The second trench 14b has a distance between facing sidewalls longer than a distance between facing sidewalls of the first trench 14a. Thus, the trench 14 has a bottle shape.

In the present embodiment, a connection portion between the first trench 14a and the second trench 14b has a shape with a curvature (i.e., a rounded shape), so that the first trench 14a and the second trench 14b are smoothly connected to each other. Here, not shown in the drawing, the connection portion between the first trench 14a and the second trench 14b may be steeply changed so as to be an almost right angle.

A part of the gate insulation film 14 formed on the sidewall of the second trench 14b is thicker than another part of the gate insulation film 14 formed on the sidewall of the first trench 14a. Thus, a part of the gate insulation film 15 formed on the sidewall of the trench 14 on the other surface 10b side of the semiconductor substrate 10 from the peak position of the CS layer 13 (i.e., on the collector layer 22 side later described) is thicker than another part of the gate insulation film 15 formed on the sidewall of the trench 14 disposed on the opening portion side of the trench 14 from the peak position. In other words, the thickness of the part of the gate insulation film 15 formed on the sidewall of the trench 14 contacting the CS layer 13 and disposed on the other surface 10b side of the semiconductor substrate 10 from the peak position is thicker than the thickness of the other part of the gate insulation film 15 formed on the sidewall of the trench 14 disposed on the opening portion side of the trench 14 from the peak position.

Here, in the present embodiment, a part of the gate insulation film 15 formed on a bottom of the second trench 14b is also thicker than a part of the gate insulation film 15 formed on the sidewall of the first trench 14a. Thus, all parts of the gate insulation film 15 formed on the sidewall of the second trench 14b is thicker than a part of the gate insulation film 15 formed on the sidewall of the first trench 14a. Although not limited, in the present embodiment, the thickness of the part of gate insulation film 15 formed on the sidewall of the first trench 14a is 100 nanometers, and the thickness of the part of the gate insulation film 15 formed on the sidewall of the second trench 14b is 200 nanometers. The gate insulation film 15 formed on the sidewall of the trench 14 includes a portion formed by a CVD method or the like on the sidewall of the trench 14 and a portion formed by a thermal oxidation method or the like on the sidewall of the trench 14.

In the present embodiment, the trench gate structure is formed as described above. Accordingly, regarding the distance between adjacent trenches 14, the distance A between adjacent second trenches 14b is shorter than the distance B between adjacent first trenches 14a.

An emitter region 17 having the N+ conductive type and a body region 18 having the P+ conductive type sandwiched between the emitter regions 17 are formed in surface portions of the base layer 12. The emitter region 17 has an impurity concentration higher than the drift layer 11. The emitter region 17 ends in the inside of the base layer 12, and further, contacts with the sidewall of the trench 14. On the other hand, the body region 18 has an impurity concentration higher than the base layer 12, and ends in the inside of the base layer 12, similar to the emitter region 17.

Specifically, the emitter region 17 extends along the extending direction of the trench 14 so as to have a bar shape and to contact with the sidewall of the trench 14 in an area between adjacent trenches 14. The emitter region 17 has a structure to end on an inner side from a top end of the trench 14. Similarly, the body region 18 extends along the extending direction of the trench 14 so as to have a rod shape and to be sandwiched between two emitter regions 17. The body region 18 has a structure to end on an inner side from a top end of the trench 14. Here, in the present embodiment, the body region 18 is formed to be deeper than the emitter region 17 with reference to the one surface 10a of the semiconductor substrate 10.

An interlayer insulation film 19 made of BPSG or the like is formed on the one surface 10a of the semiconductor substrate 10. A contact hole 19a is formed in the interlayer insulation film 19 to expose a part of the emitter region 17 and the body region 18 from the interlayer insulation film 19. The emitter electrode 20 is formed on the interlayer insulation film 19 to be electrically connected to the emitter region 17 and the body region 18 via the contact hole 19a.

A field stop layer 21 (i.e., a FS layer) having the N conductive type is formed on a side of the drift layer 11 opposite to the base layer 12 side (i.e., on the other surface 10b side of the semiconductor substrate 10). The FS layer 21 is not always necessary, but the FS layer 21 prevents the depletion layer from expanding so that the breakdown voltage and the steady loss are improved, and further, the injection amount of the hole injected from the other surface 10b side of the semiconductor substrate 10 is controlled.

The collector layer 22 having the P+ conductive type is formed to be opposite to the drift layer 11 and to sandwich the FS layer with the drift layer 11. The collector electrode 23 is formed on the collector layer 22 (i.e., on the other surface 10b side of the semiconductor substrate 10) to be electrically connected to the collector layer 22.

Thus, the semiconductor device according to the present embodiment is described above. Here, in the present embodiment, the N+ conductive type and the N− conductive type correspond to the first conductive type, and the P conductive type and the P+ conductive type correspond to the second conductive type. Next, the operation of the semiconductor device will be explained.

Figure 2:
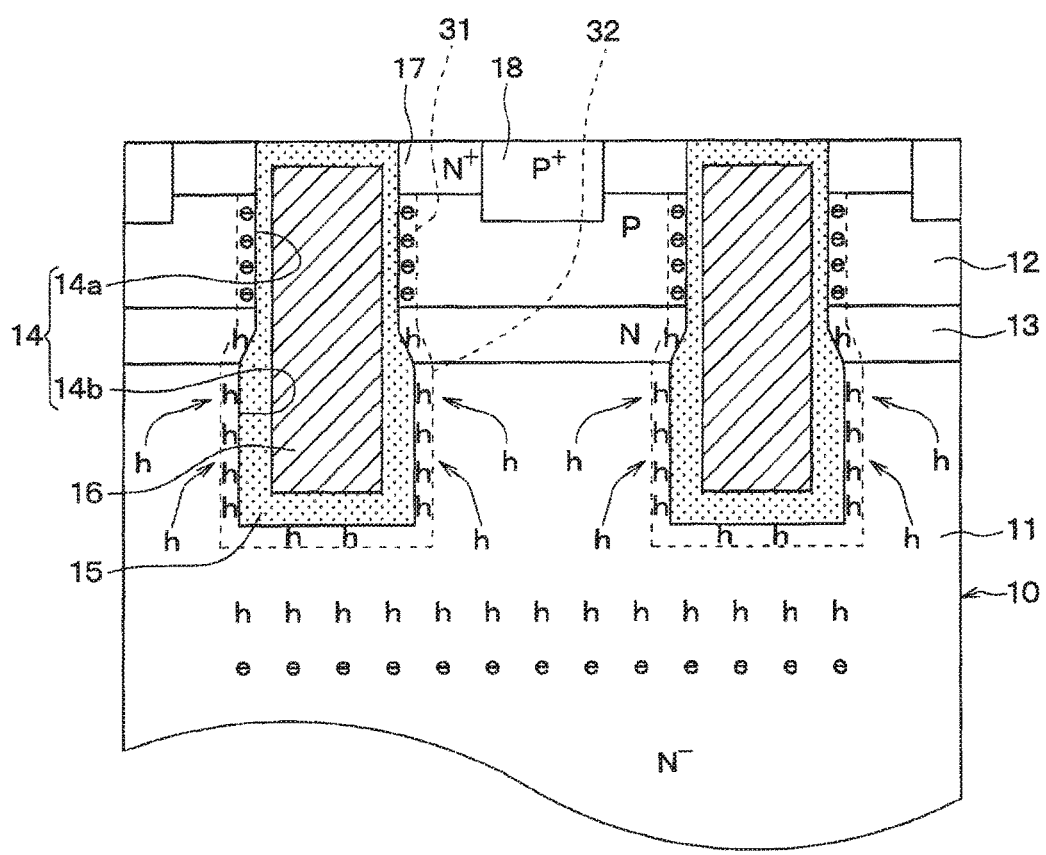
FIG. 2 is a diagram showing an intermediate state while the semiconductor device is transferring from the on state to the off state.

In the above semiconductor device, the emitter electrode 20 is grounded, and the positive voltage is applied to the collector electrode 23. When the predetermined voltage is applied from the gate control circuit not shown such that the gate potential of the gate electrode 16 is equal to or larger than the threshold voltage Vth of the insulation gate structure, the inversion layer (i.e., the channel) having the N conductive type for connecting between the emitter region 17, the CS layer 13 and the drift layer 11 is formed at a portion of the base layer 12 contacting the trench 14, and further, the accumulation layer 32 of the electron is formed at a portion of the drift layer 11 and a portion of the CS layer 13 contacting the trench 14, as shown in FIG. 2. The electron is supplied from the emitter region 17 to the drift layer 11 via the inversion layer, and the hole is supplied from the collector layer 22 to the drift layer 11, so that the resistance of the drift layer 11 is reduced by the conductivity modulation, and the device becomes an on state. Here, in FIG. 2, the interlayer insulation film 19 and the emitter electrode 20 and the like are not shown.

In the above case, the gate potential of the gate electrode 16 increases gradually by the voltage applied from the gate control circuit. Then, when the gate potential is equal to or larger than the threshold voltage Vth, the current flows between the collector electrode 23 and the emitter electrode 20. At this moment, the hole supplied to the drift layer 11 is restricted by the CS layer 13 from being discharged from the emitter electrode 20, and the hole is drawn to the accumulation layer 32. Specifically, since the hole is easily accumulated near the CS layer 13, a large amount of hole is easily accumulated at a portion of the accumulation layer 32 contacting the sidewall of the second trench 14b.

Figure 3:
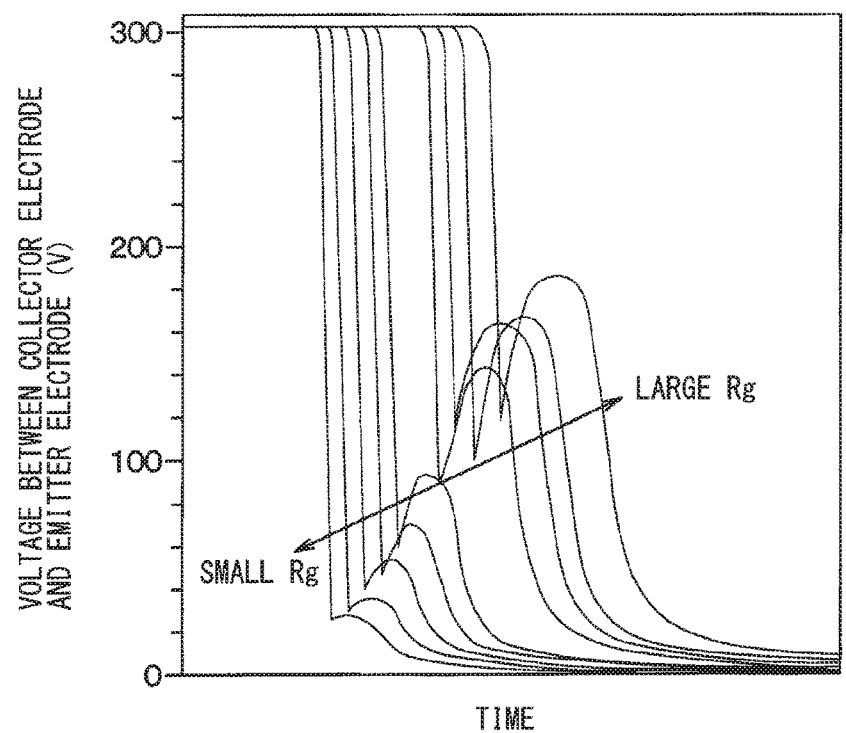
FIG. 3 is a diagram showing a relationship between a voltage and time, the voltage between the collector electrode and the emitter electrode in the semiconductor device having a uniform thickness of a gate insulation film.

Accordingly, in a conventional semiconductor device having the gate insulation film 15 formed uniformly on the sidewall of the trench 14, the gate potential of the gate electrode 16 may be easily changed by the hole accumulated in the accumulation layer 32. Thus, as shown in FIG. 3, before the gate potential sufficiently becomes high (i.e., before the voltage between the collector electrode and the emitter electrode becomes constant), a change occurs such that the voltage between the collector electrode and the emitter electrode steeply increase. Here, after the gate potential increase sufficiently, since the current stably flows between the collector electrode 23 and the emitter electrode 20, there is no difficulty even if the gate potential is increased by the hole.

Figure 4:
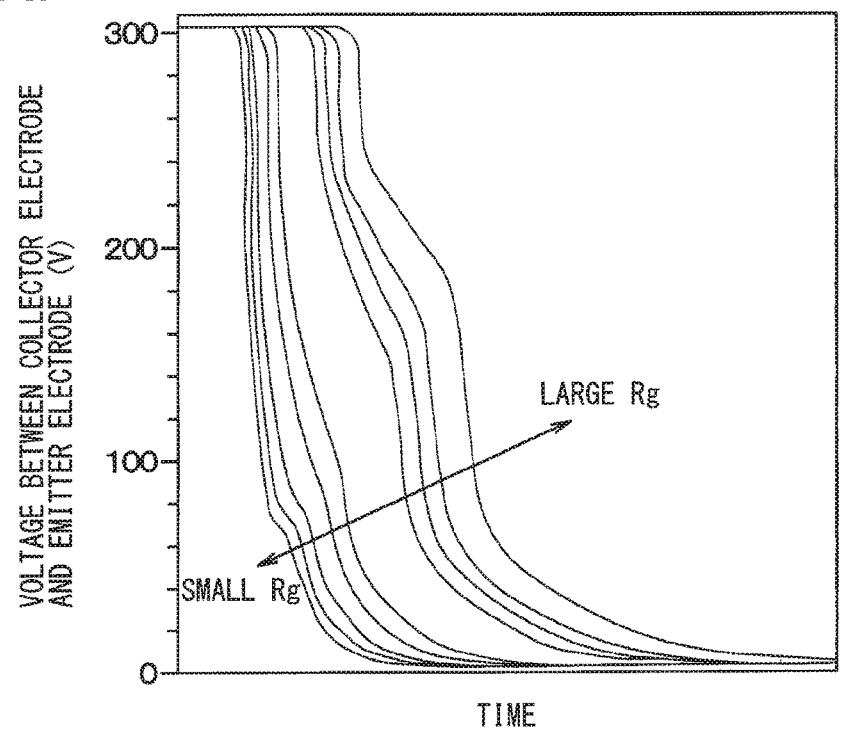
FIG. 4 is a diagram showing a relationship between a voltage and time, the voltage between the collector electrode and the emitter electrode in the semiconductor device shown in FIG. 1.

On the other hand, in the present embodiment, the thickness of the part of the gate insulation film 15 formed on the sidewall of the second trench 14b is thicker than the thickness of the part of the gate insulation film 15 formed on the sidewall of the first trench 14a. Thus, the part of the gate insulation film 15 contacting a portion of the accumulation layer 32 where the hole is easily accumulated. Accordingly, as shown in FIG. 4, even if a large amount of hole is accumulated at apportion of the accumulation layer 32 near the CS layer 13, the gate potential is restricted by the hole from changing. Accordingly, when the semiconductor device is switched from the off state to the on state, before the gate potential sufficiently increases (i.e., before the voltage between the collector electrode and the emitter electrode becomes constant), the voltage between the collector electrode and the emitter electrode is restricted from rapidly increasing (i.e., the voltage has a waveform that the voltage is gradually reduced). Thus, the reduction of switching controllability is restricted.

FIG. 3 shows a simulation result when the thickness of the gate insulation film 15 is 100 nanometers. FIG. 4 shows a simulation result when the thickness of the part of the gate insulation film 15 formed on the sidewall of the first trench 4a is 100 nanometers, and the thickness of the part of the gate insulation film 15 formed on the sidewall of the second trench 4b is 200 nanometers. Further, the feature Rg in FIGS. 3 and 4 indicates the gate resistance. As shown in FIGS. 3 and 4, even when the magnitude of the gate resistance Rg is changed, the fundamental waveform is not substantially changed although the time when the current starts to flow is different. When the thickness of the gate insulation film 15 is homogeneous (i.e., in FIG. 3), the variation occurs such that the voltage between the collector electrode and the emitter electrode rapidly increases.

The hole is restricted from being discharged from the emitter electrode 20 since the CS layer 13 provides the potential barrier. The potential barrier becomes large at the peak position of the CS layer 13. Accordingly, the hole is easily concentrated at the peak position of the CS layer 13, and the hole is easily accumulated at the portion of the accumulation layer 32 neat the peak position. Thus, the hole is most easily accumulated at the portion of the accumulation layer 32 formed in the CS layer 13 disposed on the collector layer 22 side from the peak position.

Accordingly, in the present embodiment, the thickness of the part of the gate insulation film 15 formed on the sidewall of the trench 14 contacting the CS layer 13 disposed on the collector layer 22 side from the peak position is thicker than the thickness of the part of the gate insulation film 15 formed on the sidewall of the trench 14 disposed on the opening portion side from the peak position. Thus, the part of the gate insulation film 15 contacting the accumulation layer 32 at which the hole is easily accumulated is thick. Accordingly, the gate potential is effectively restricted from rapidly increasing when the device is switched from the off state to the on state.

As described above, in the present embodiment, the part of the gate insulation film 15 formed on the sidewall of the second trench 14b is thicker than the part of the gate insulation film 15 formed on the sidewall of the first trench 14a. Accordingly, even when the large amount of hole is accumulated in the accumulation layer 32 near the CS layer 13, the gate potential is restricted from varying by the hole. Accordingly, when the semiconductor device is switched from the off state to the on state, the rapid change of the voltage increasing between the collector electrode and the emitter electrode is restricted from occurring, so that the reduction of the switching controllability is limited (see FIG. 4). Thus, in the semiconductor device according to the present embodiment, the impurity concentration of the CS layer 13 is increased so that the on state voltage is reduced, and further, the reduction of the switching controllability is restricted.

Furthermore, in the present embodiment, the thickness of the part of the gate insulation film 15 formed on the sidewall of the trench 14 contacting the CS layer disposed on the collector layer 22 side from the peak position is thicker than the thickness of the part of the gate insulation film 15 formed on the sidewall of the trench 14 disposed on the opening portion side from the peak position. Thus, the part of the gate insulation film 15 contacting the accumulation layer 32 at which the hole is easily accumulated is thick. Accordingly, the variation of the gate potential is much effectively restricted.

Further, in the present embodiment, the part of the gate insulation film 15 formed on the bottom of the second trench 14b is thicker than the part of the gate insulation film 15 formed on the first trench 14a. Accordingly, although the hole is easily accumulated in the accumulation layer 32 near the CS layer 13, the hole is also accumulated at a portion of the accumulation layer 32 contacting a portion spaced apart from the CS layer 13 (i.e., a portion on the bottom of the second trench 14b). Thus, the variation of the gate potential is restricted by the hole accumulated at the portion.

Further, in the present embodiment, regarding the distance between adjacent trenches 14, the distance A between adjacent second trenches 14b is shorter than the distance B between adjacent first trenches 14a. Accordingly, comparing a case where the distance between adjacent trenches 14 is constant to be equal to the distance B between adjacent first trenches 14a, the hole is more easily accumulated in the drift layer 11 so that the on state voltage is further reduced.

Second Embodiment

A second embodiment will be explained. In the present embodiment, the trench gate structure is different from the first embodiment. Other features are similar to the first embodiment, and therefore, the other features are not explained.

Figure 5:
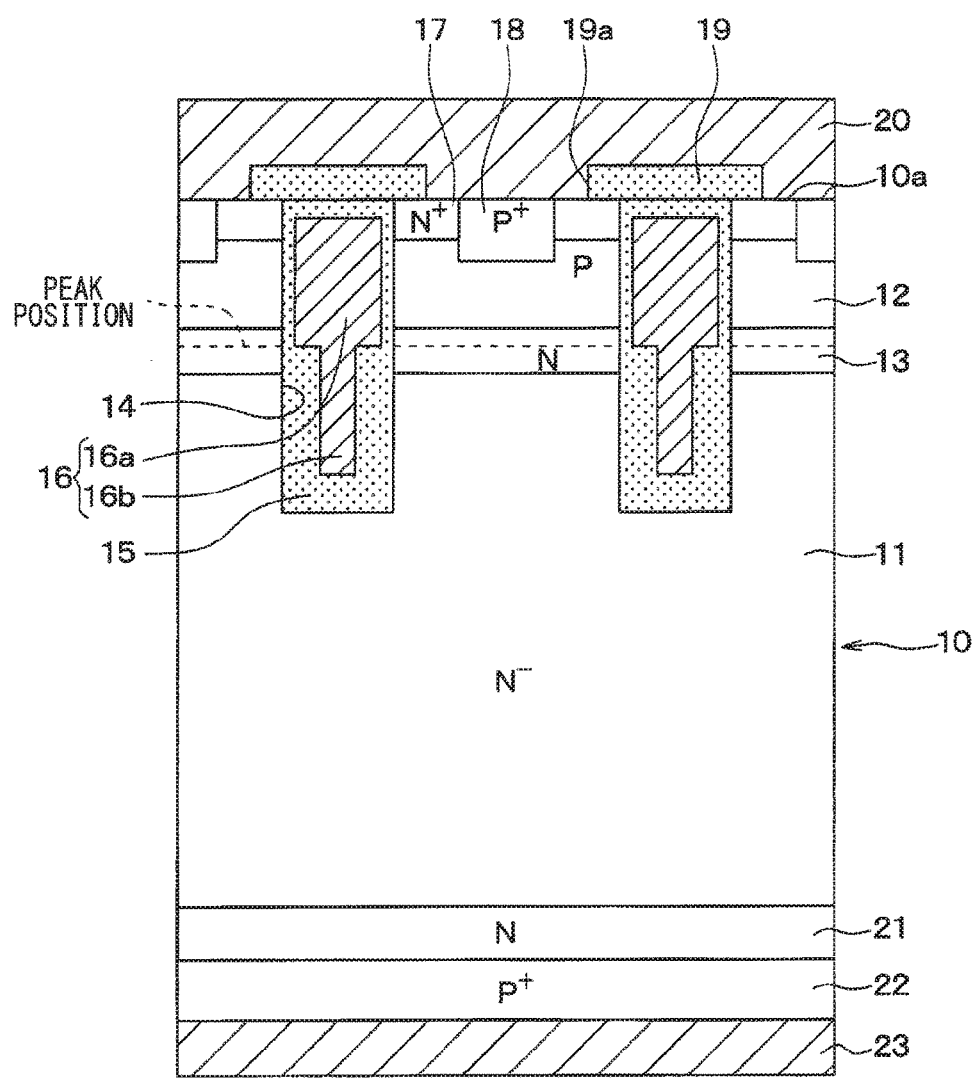
FIG. 5 is a diagram showing a cross sectional view of a semiconductor device according to a second embodiment.

In the present embodiment, as shown in FIG. 5, the distance between facing sidewalls in the trench 14 along the direction perpendicular to the one surface 10a of the semiconductor substrate 10 is constant. Thus, the trench 14 is configured to only one trench.

The gate electrode 16 includes a first gate electrode 16a formed from the opening portion side of the trench 14 to the peak position and a second gate electrode 16b connected to the first gate electrode 16a at the peak position and arranged on the bottom side of the trench 14. The width of the first gate electrode 16a is longer than the width of the second gate electrode 16b.

Here, the first gate electrode 16a and the second gate electrode 16b are electrically connected to each other. Further, the width of the first gate electrode 16a and the width of the second gate electrode 16b are defined as a length in a direction perpendicular to the extending direction of the trench 14 and in parallel to the planar direction of the one surface 10a of the semiconductor substrate 10 (i.e., a right-left direction of the sheet of the drawing in FIG. 5). Thus, in the present embodiment, similar to the first embodiment, the thickness of the part of the gate insulation film 15 formed on the sidewall of the trench 14 contacting the CS layer 13 disposed on the collector layer 22 side from the peak position is thicker than the thickness of the part of the gate insulation film 15 formed on the sidewall of the trench 14 disposed on the opening portion side from the peak position.

In the above semiconductor device, since the thickness of the part of the gate insulation film 15 formed on the sidewall of the trench 14 disposed on the collector layer 22 side from the peak position of the CS layer 13 is thicker than the thickness of the part of the gate insulation film 15 formed on the sidewall of the trench 14 disposed on the opening portion side from the peak position, effects similar to the first embodiment are obtained.

Other Embodiments

For example, the first embodiment is described such that the first conductive type corresponds to the N conductive type, and the second conductive type corresponds to the P conductive type. The first conductive type may correspond to the P conductive type, and the second conductive type may correspond to the N conductive type.

Figure 6:
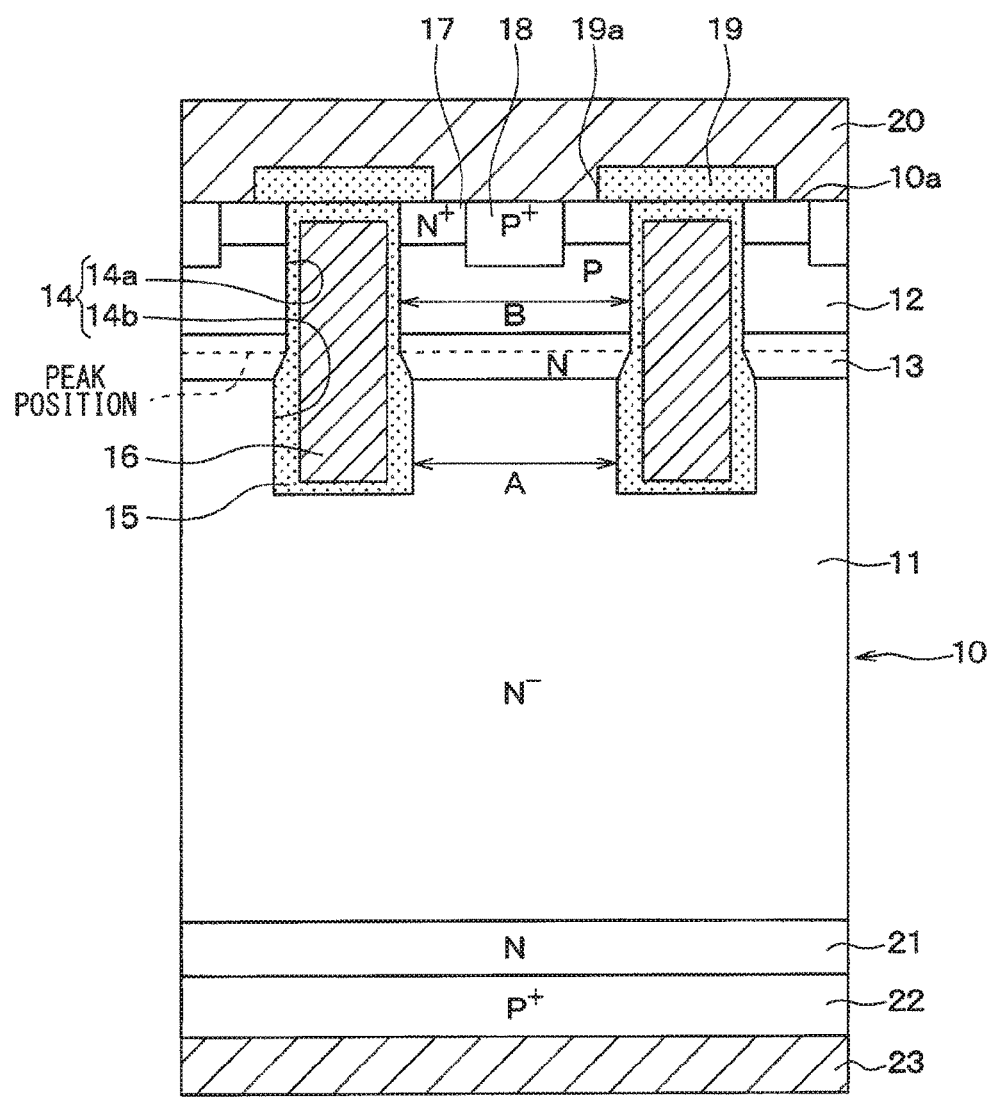
FIG. 6 is a diagram showing a cross sectional view of a semiconductor device according to another embodiment.

In the above first embodiment, as described above, a large amount of hole is accumulated in the accumulation layer 32 near the CS layer 13 (i.e., on the sidewall of the trench 14 near the CS layer 13). Thus, as shown in FIG. 6, the thickness of the part of the gate insulation film 15 formed on the bottom of the second trench 14b may be equal to the thickness of the part of the gate insulation film 15 formed on the sidewall of the first trench 14a. Specifically, the thickness of the part of the gate insulation film 15 formed on the bottom of the second trench 14b may be thinner than the thickness of the part of the gate insulation film 15 formed on the sidewall of the second trench 14b. Similarly, in the above second embodiment, the thickness of the part of the gate insulation film 15 formed on the bottom of the trench 14 may be equal to the thickness of the part of the gate insulation film 15 formed on the opening portion side of the trench 14 from the peak position of the CS layer 13.

Further, in the above first and second embodiments, examples are explained such that the thickness of the part of the gate insulation film 15 formed on the sidewall of the second trench 14b is wholly thicker than the thickness of the gate insulation film 15 formed on the sidewall of the first trench 14a. Alternatively, as long as the thickness of at least a portion of the part of the gate insulation film 15 formed on the sidewall of the second trench 14b is thicker than the thickness of the gate insulation film 15 formed on the sidewall of the first trench, the variation of the gate potential is restricted by the at least the thick portion of the part. Specifically, when the thickness of at least a portion of the part of the gate insulation film 15 formed on the sidewall of the trench 14 disposed on the collector layer 22 side from the peak position of the CS layer 13 at which the impurity concentration is the highest is thicker than the thickness of the gate insulation film 15 formed on the sidewall of the trench 14 disposed on the opening portion side of the trench 14 from the peak position of the CS layer 13, the variation of the gate potential is restricted by the at least the thick portion of the part. For example, in the first and second embodiments, the thickness of only the part of the gate insulation film 15 formed on the sidewall of the trench 14 contacting the drift layer 11 may be thicker than the thickness of the gate insulation film 15 formed on the sidewall of the trench 14 disposed on the opening portion side of the trench 14 from the peak position. Similarly, in the above first and second embodiments, the thickness of only the part of the gate insulation film 15 formed on the sidewall of the trench 14 contacting the CS layer 13 disposed on the collector layer 22 side from the peak position may be thicker than the thickness of the part of the gate insulation film 15 formed on the sidewall of the trench 14 disposed on the opening portion side of the trench 14 from the peak position.

In the above first and second embodiments, the CS layer 13 may divide the base layer 12 into an upper region and a lower region at the inside of the base layer 12 not at a boundary between the drift layer 11 and the base layer 12. Specifically, the lower region of the base layer 12, the CS layer 13 and the upper region of the base layer 12 may be arranged on the drift layer 11 in this order.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A semiconductor device comprising:
   a semiconductor substrate having a drift layer with a first conductive type;
   a base layer having a second conductive type and disposed on the drift layer;
   a carrier storage layer having the first conductive type with an impurity concentration higher than the drift layer, the carrier storage layer being arranged over the drift layer and having an impurity concentration that varies in a direction perpendicular to a planar direction of the semiconductor substrate and includes a peak position of highest impurity concentration;
   a collector layer having the second conductive type and arranged on the drift layer opposite to the base layer;
   a plurality of trenches penetrating the base layer and the carrier storage layer, reaching the drift layer, and arranged along one direction of the planar direction of the semiconductor substrate;
   a gate insulation film arranged on a sidewall of each trench;
   a gate electrode arranged on the gate insulation film; and
   an emitter region having the first conductive type, arranged in a surface portion of the base layer, and contacting each trench, wherein:
   a thickness of at least a portion of a part of the gate insulation film arranged on a sidewall of each trench disposed on a collector layer side from the peak position that is thicker than a thickness of another part of the gate insulation film arranged on the sidewall of each trench disposed on an opening portion side of the trench from the peak position.

2. The semiconductor device according to claim 1, wherein:
   the carrier storage layer has a peak position at a middle position of the carrier storage layer in a stacking direction of the drift layer and the base layer; and
   the thickness of the part of the gate insulation film arranged on the sidewall of each trench contacting the carrier storage layer disposed on the collector layer side from a peak position is thicker than the thickness of the another part of the gate insulation film arranged on the sidewall of each trench disposed on the opening portion side of the trench from a peak position.

3. The semiconductor device according to claim 1, wherein:
   each trench includes a first trench providing an opening portion and arranged to the peak position and a second trench connecting to the first trench, reaching the drift layer, and having a distance between facing sidewalls longer than a distance between facing sidewalls of the first trench;
   the part of the gate insulation film arranged on the sidewall of the second trench is thicker than the another part of the gate insulation film arranged on the sidewall of the first trench; and
   a distance between adjacent second trenches is shorter than a distance between adjacent first trenches.

4. The semiconductor device according to claim 1, wherein:
   each trench has a constant distance between facing sidewalls;
   the gate electrode includes a first gate electrode arranged from the opening portion side of the trench to the peak position and a second gate electrode connecting to the first gate electrode at the peak position and arranged on a bottom side of the trench; and
   the first gate electrode has a width larger than a width of the second gate electrode.

5. The semiconductor device according to claim 1, wherein:
   the thickness of further another part of the gate insulation film arranged on a bottom of each trench is thicker than the thickness of the another part of the gate insulation film arranged on the sidewall of each trench disposed on the opening portion side of the trench from the peak position.

* * * * *